(12) United States Patent
Miyoshi et al.

(10) Patent No.: US 9,202,763 B2
(45) Date of Patent: Dec. 1, 2015

(54) DEFECT PATTERN EVALUATION METHOD, DEFECT PATTERN EVALUATION APPARATUS, AND RECORDING MEDIA

(71) Applicant: KABUSHIKI KAISHA TOSHIBA, Tokyo (JP)

(72) Inventors: Seiro Miyoshi, Mie (JP); Toshiyuki Aritake, Mie (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 138 days.

(21) Appl. No.: 13/829,200

(22) Filed: Mar. 14, 2013

(65) Prior Publication Data

US 2014/0199792 A1 Jul. 17, 2014

Related U.S. Application Data

(60) Provisional application No. 61/753,061, filed on Jan. 16, 2013.

(51) Int. Cl.
*G06K 9/00* (2006.01)
*H01L 21/66* (2006.01)

(52) U.S. Cl.
CPC ............... *H01L 22/12* (2013.01); *H01L 22/20* (2013.01); *H01J 2237/24592* (2013.01); *H01J 2237/2817* (2013.01)

(58) Field of Classification Search
None
See application file for complete search history.

(56) References Cited

U.S. PATENT DOCUMENTS

| 6,775,817 | B2 | 8/2004 | Ono et al. |
| 7,570,796 | B2 | 8/2009 | Zafar et al. |
| 7,570,800 | B2 | 8/2009 | Lin et al. |
| 7,676,077 | B2 | 3/2010 | Kulkarni et al. |
| 7,729,529 | B2 | 6/2010 | Wu et al. |
| 7,975,245 | B2 | 7/2011 | Florence et al. |
| 8,139,843 | B2 | 3/2012 | Kulkarni et al. |
| 2010/0106447 | A1 | 4/2010 | Yamada |

FOREIGN PATENT DOCUMENTS

| JP | 2002-141384 A | 5/2002 |
| JP | 2004-191297 A | 7/2004 |
| JP | 2007-266391 A | 10/2007 |
| JP | 2008-082740 A | 4/2008 |
| JP | 2009-516832 A | 4/2009 |
| JP | 2010-133929 A | 6/2010 |
| JP | 2012-089635 A | 5/2012 |
| WO | 2007/120279 A2 | 10/2007 |
| WO | 2007/120280 A2 | 10/2007 |

*Primary Examiner* — Randolph I Chu
(74) *Attorney, Agent, or Firm* — Posz Law Group, PLC

(57) ABSTRACT

According to a defect pattern evaluation method of an embodiment, defects are detected by performing optical defect inspection on a pattern on a substrate. Then, the defects are classified according to a type of a pattern layout using a pattern layout corresponding to coordinates of the defects. Further, a computer calculates a defect occurrence rate by dividing the number of defects of each pattern layout by an arrangement number of the pattern layouts in an inspection region. Then, the defect occurrence rate of each pattern layout is output as an evaluation result.

20 Claims, 10 Drawing Sheets

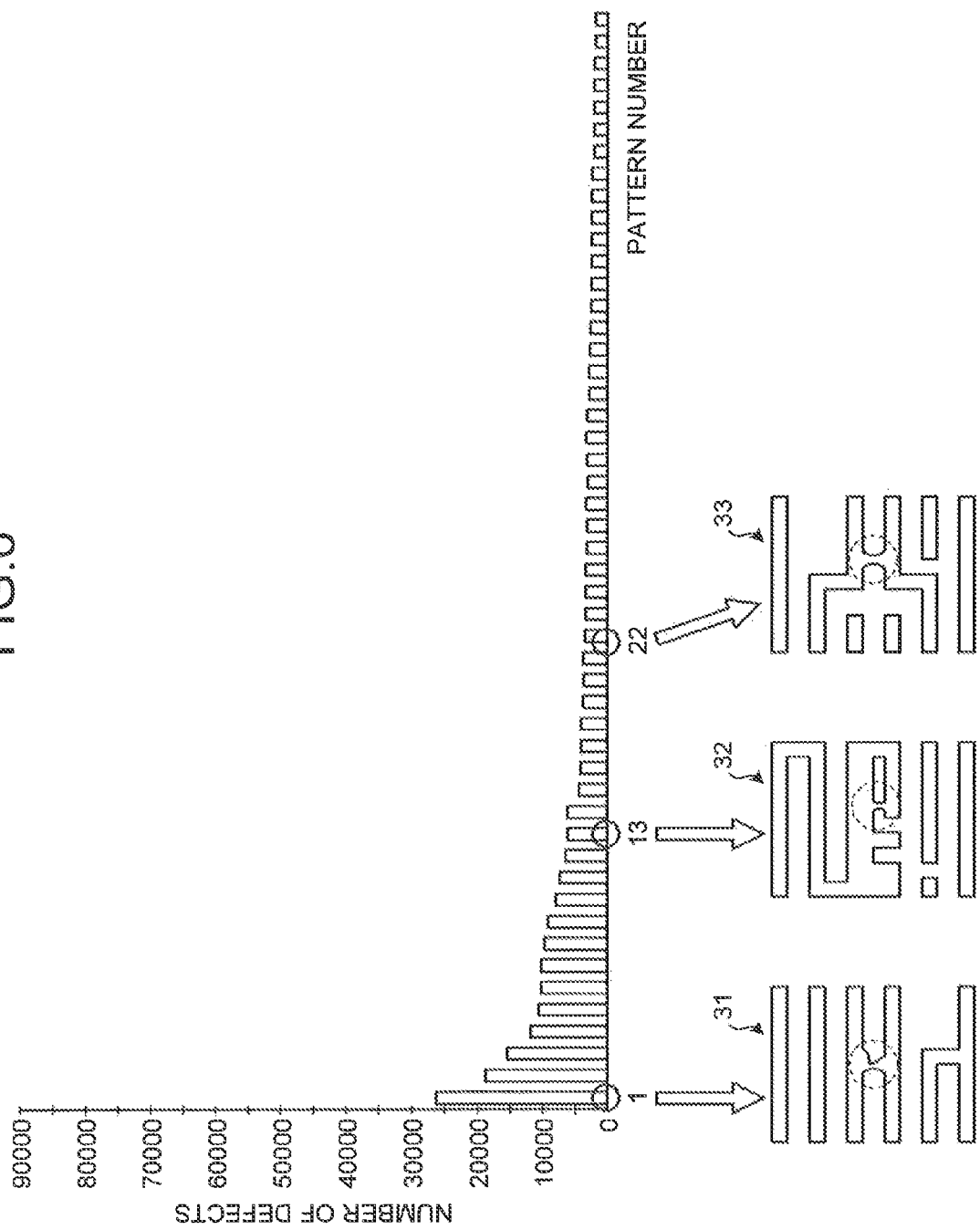

DEFECT PATTERN EVALUATION METHOD, DEFECT PATTERN EVALUATION APPARATUS, AND RECORDING MEDIA

CROSS-REFERENCE TO RELATED APPLICATIONS

This application is based upon and claims the benefit of priority from U.S. Provisional Application No. 61/753,061, filed on Jan. 16, 2013; the entire contents of which are incorporated herein by reference.

FIELD

Embodiments described herein relate generally to a defect pattern evaluation method, a defect pattern evaluation apparatus, and a recording media.

BACKGROUND

When semiconductor devices are manufactured, in order to improve a manufacturing yield of semiconductor devices, pattern defect inspection is performed after a predetermined process such as the lithography. The pattern defects are classified into random defects caused by device dust and systematic defects caused depending on the type of a pattern.

In order to evaluate the systematic defects, patterns having a defect are first classified according to the type. At this time, a method such as design based binning (DEE) may be used as a pattern classifying method. In this method, after the defect inspection, patterns are classified such that defect coordinates are associated with pattern information (for example, design data) corresponding to the defect coordinates. Then, patterns having a defect are lined up and displayed in the descending order of the number of patterns detected by the defect inspection, and evaluation of patterns which are likely to have a defect is performed.

Meanwhile, when patterns having a defect are lined up based on the number of patterns in which a defect is detected, it is difficult to accurately extract a pattern having a defect which is small in the detected number but important. For this reason, it is desirable to accurately extract a pattern having a defect which is small in the detected number but important.

BRIEF DESCRIPTION OF THE DRAWINGS

FIG. 6 is a diagram for describing a defect number of each pattern layout;

DETAILED DESCRIPTION

According to an embodiment, there is provided a defect pattern evaluation method. In the defect pattern evaluation method, defects are detected by performing optical defect inspection on a pattern on a substrate after a predetermined process for manufacturing a semiconductor device. Then, the defects are classified according to a type of a pattern layout using a pattern layout corresponding to coordinates of the defects.

Further, a computer calculates a defect occurrence rate by dividing the number of defects of each pattern layout by an arrangement number of the pattern layouts in an inspection region. Then, the defect occurrence rate of each pattern layout is output as an evaluation result.

A defect pattern evaluation method, a defect pattern evaluation apparatus, and a recording media according to an embodiment will be described in detail with reference to the accompanying drawings. The present invention is not limited to the following embodiment.

Figure 1:
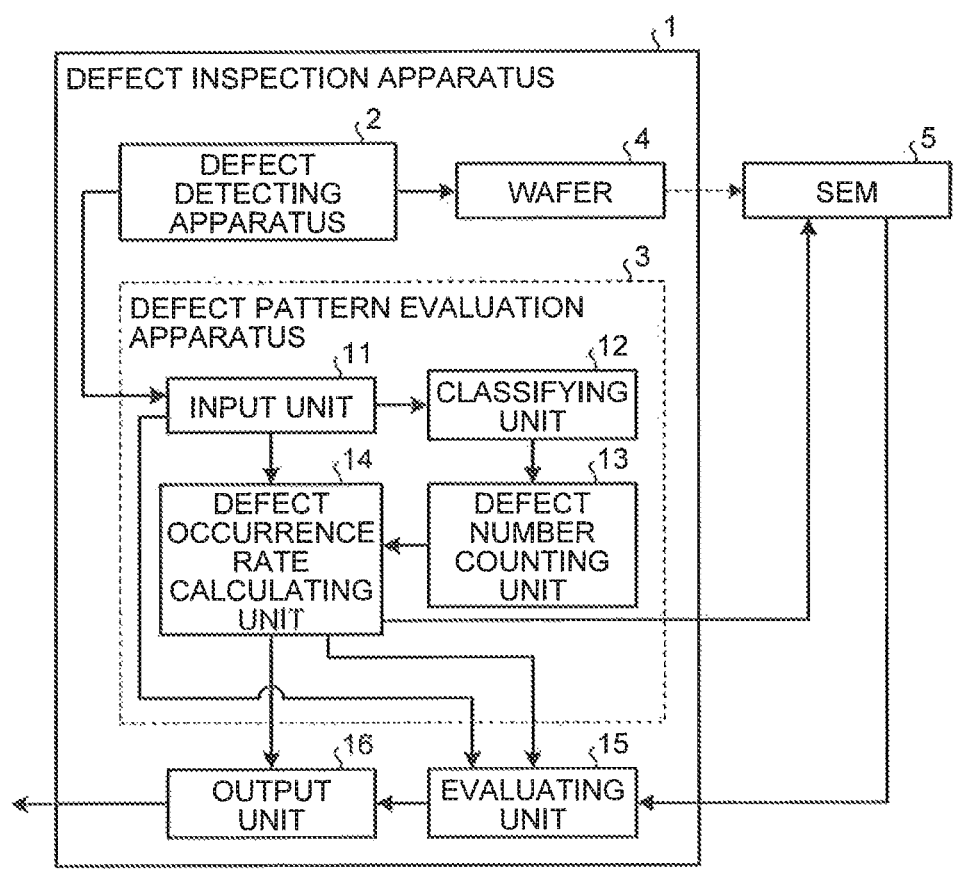
FIG. 1 is a diagram illustrating a configuration of a defect evaluation system including a defect pattern evaluation apparatus according to an embodiment.

FIG. 1 is a diagram illustrating a configuration of a defect evaluation system including a defect pattern evaluation apparatus according to an embodiment. The defect evaluation system is a system that performs a defect inspection of a wafer 4 as a manufacturing process verification when a semiconductor device is manufactured. The defect evaluation system classifies defect inspection results according to a pattern layout and detects a systematic defect. The defect evaluation system according to the present embodiment extracts a defect which is high in a probability to be a defect or a probability (a defect occurrence rate) to be detected as a defect rather than the descending order of the number of defects, and then performs an evaluation. Thus, even a defect extracted as one of a small number of defects since the number of original patterns is small can be extracted as a defect (a defect limiting a process margin) having a high defect occurrence rate.

The defect evaluation system is configured to include a defect inspection apparatus 1 and a scanning electron microscope (SEM) 5. The defect inspection apparatus 1 is an apparatus that performs a defect inspection on a substrate (the wafer 4) on which a semiconductor device is formed through an optical inspection or the like. The defect inspection apparatus 1 detects a defect (a random defect or a systematic defect) of a pattern formed on the wafer 4. The random defect is a defect that does not depend on the layout of a pattern, and caused by device dust or the like. The systematic defect is a defect that depends on the layout of a pattern, and caused since a process margin is insufficient. Examples of the process margins include a dose or focus margin at the time of exposure of the lithography and a margin in etching at the time of a hard mask process.

In the present embodiment, the systematic defect is used as a risk pattern (a pattern in which a probability having a pattern forming defect is higher than a predetermined value), and used for a process margin evaluation or the like.

The defect inspection apparatus 1 includes a defect detecting apparatus 2, a defect pattern evaluation apparatus 3, an evaluating unit 15, and an output unit 16. The defect detecting apparatus 2 performs a defect inspection on patterns formed in various process conditions for each short on the wafer 4. For example, the defect detecting apparatus 2 performs a defect inspection of the wafer 4 after the lithography, the hard mask process, gate pattern forming, interconnection pattern forming, or the like. The following description will proceed in connection with an example in which the defect inspection of the wafer 4 is performed after the lithography.

The defect detecting apparatus 2 detects a defect on the wafer 4. The defect detecting apparatus 2 associates the position of a defect (a shot position and coordinates in a short) with an image of a defect (a pattern image around a defect), and transmits the associated information to the defect pattern evaluation apparatus 3 as detection defect information.

The defect pattern evaluation apparatus 3 is an apparatus such as a computer of evaluating a defect occurrence probability for each layout of a pattern, and the defect pattern evaluation apparatus 3 includes an input unit 11, a classifying unit 12, a defect number counting unit 13, and a defect occurrence rate calculating unit 14.

The input unit 11 receives the detection defect information transmitted from the defect detecting apparatus 2, a pattern layout (a pattern layout of one shot) of a pattern (an evaluation target pattern) formed on the wafer 4, and a process condition (focus, dose, or the like) of each shot set on the wafer 4. The input unit 11 transfers the detection defect information and the pattern layout to the classifying unit 12. Further, the input unit 11 transmits the pattern layout to the defect occurrence rate calculating unit 14, and transfers the process condition of each shot to the evaluating unit 15.

The classifying unit 12 classifies defects detected by the defect detecting apparatus 2 according to a pattern layout based on the detection defect information and the pattern layout. At this time, the classifying unit 12 classifies defects having the same pattern layout among defects as a defect of the same type.

The classifying unit 12 classifies defects having the pattern layout which are the same in a predetermined range including a defect as defects of the same type. For example, the classifying unit 12 sets a range used for classification determination as a predetermined range (for example, any of 1 μm angle to 10 μm angle) centering on a defect. Further, the classifying unit 12 may regard defects whose defect coordinates are slightly (for example, 1 μm) different as defects of the same type. Further, the classifying unit 12 may regard rotated or mirror-inverted patterns having the same pattern layout as before rotation or mirror inversion as the same pattern layout. Further, the classifying unit 12 may regard extremely similar pattern layouts as the same pattern layout. The classifying unit 12 performs defect classification, for example, using a design based binning (DBE).

The classifying unit 12 associates the detection defect information (the position and image of a defect) with the classification result, and transfers the associated information to the defect number counting unit 13 as classification information. Thus, the classification information transferred from the classifying unit 12 to the defect number counting unit 13 includes information related to the pattern layout in which each defect occurs, the position of a defect, and an image of a defect.

The defect number counting unit 13 counts the number of defects of each pattern layout based on the classification information. The defect number counting unit 13 associates the defect number (counting result) of defects occurred in the same pattern layout with the classification information, and transfers the associated information to the defect occurrence rate calculating unit 14.

The defect occurrence rate calculating unit 14 counts the number of pattern layouts (hereinafter, referred to as a "defect occurrence layout") which are the same as the pattern layout having a defect and included within a predetermined inspection region (for example, a region excluding the periphery of the wafer 4) on the wafer 4. At this time, the defect occurrence rate calculating unit 14 obtains an arrangement number of defect occurrence layouts within the inspection region based on the pattern layouts of all shots transferred from the input unit 11 and the defect occurrence layout.

The defect occurrence rate calculating unit 14 calculates a defect occurrence rate to probability that a pattern will be detected as a defect) based on the arrangement number of the defect occurrence layout on the wafer 4 and the defect number (the detection number) of each pattern layout. The defect occurrence rate calculating unit 14 ranks each defect (the pattern layout) in the descending order of the defect occurrence rate.

The defect occurrence rate calculating unit 14 associates a defect occurrence ranking of each defect with the position of each defect, and transmits the associated information to the SEM 5 as defect position information. Further, the defect occurrence rate calculating unit 14 associates the defect occurrence rate, the defect occurrence ranking, the position of a defect, and the defect number with one another in units of pattern layouts, and transfers the association information to the evaluating unit 15 as defect occurrence rate information.

The evaluating unit 15 deletes information related to a random defect or a false defect (a defect occurred at a lower layer side) from the defect occurrence rate information based on information related to the type of a defect observed by the SEM 5. For example, the position of the false or random defect is transmitted from the SEM 5 to the evaluating unit 15. In this case, the evaluating unit 15 deletes the information related to the false or random defect from the defect occurrence rate information (the defect number or the like) based on the position of the false or random defect.

The evaluating unit 15 derives the process margin of the systematic defect based on the defect occurrence rate information from which the information related to the false or random defect is deleted and the process condition of each shot. The evaluating unit 15 transfers the derived process margin to the output unit 16 as the evaluation result.

The output unit 16 outputs the evaluation result to an external device (for example, a display device or the like). When the defect inspection apparatus 1 includes a display device such as a liquid crystal monitor, the evaluation result or the like is displayed on the display device.

Figure 2:
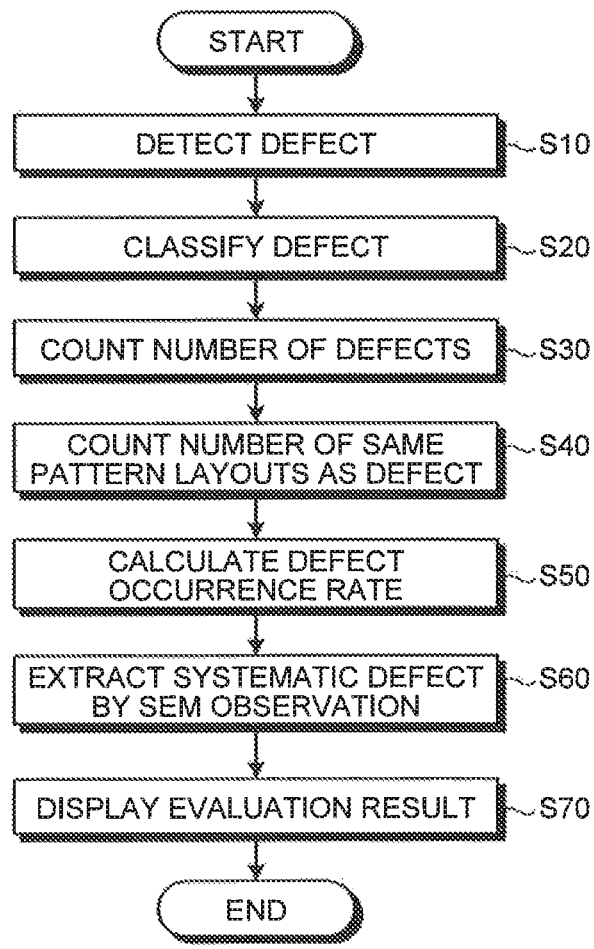
FIG. 2 is a flowchart illustrating a defect evaluation process procedure by a defect evaluation system.

Next, a defect evaluation process procedure by a defect evaluation system will be described. FIG. 2 is a flowchart illustrating a defect evaluation process procedure by a defect evaluation system. After a predetermined process for manufacturing a semiconductor device, a defect is detected such that a pattern (for example, a resist pattern) on the wafer 4 is subjected to an optical defect inspection.

Specifically, the wafer 4 is carried in the defect inspection apparatus 1. Then, the defect detecting apparatus 2 of the defect inspection apparatus 1 performs a defect inspection on each pattern on the wafer 4 (step S10). The defect detecting apparatus 2 detects a defect from an inspection region (for example, the central region excluding the periphery of the wafer 4) on the wafer 4. The defect detecting apparatus 2 associates the position of a defect detected on the wafer 4 with the image of a defect, and transmits the associated information to the defect pattern evaluation apparatus 3 as the detection defect information. Further, the defect detecting apparatus 2 may transmit only the position of a defect detected on the wafer 4 to the defect pattern evaluation apparatus 3 as the detection defect information.

The wafer 4 which has been subjected to the defect inspection by the defect detecting apparatus 2 includes a pattern formed in various process conditions for each shot. Thus, a process condition of a shot having a defect can be determined to be difficult to employ, and a process condition of a shot having no defect can be determined to be possible to employ.

Figure 3:
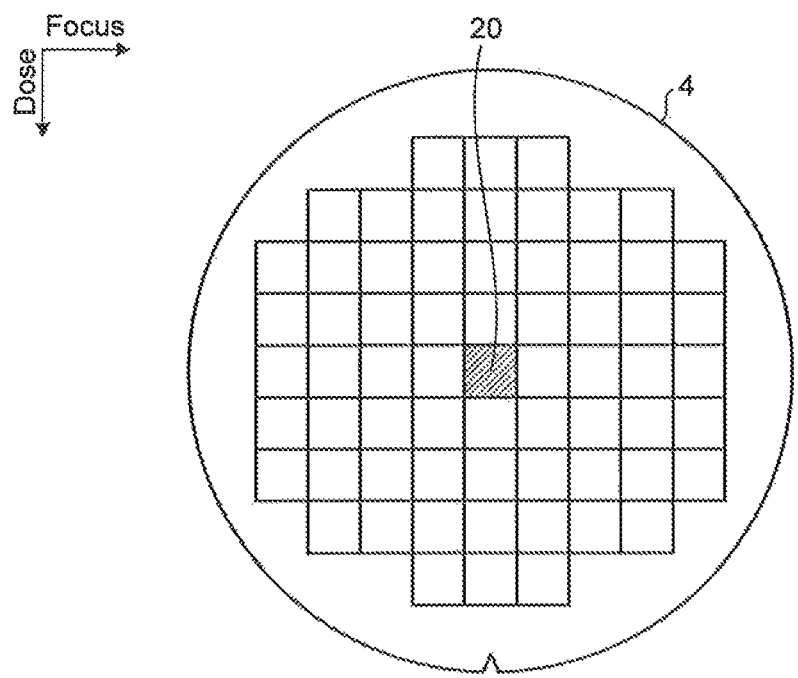
FIG. 3 is a diagram for describing a process condition set to a wafer.

FIG. 3 is a diagram for describing a process condition set to a wafer. FIG. 3 is a top view of the wafer 4. In order to check a dose or focus margin of an exposure apparatus at the time of exposure, a dose or a focus is changed in a matrix form (a focus-exposure matrix (FEM)), and then the exposure is performed.

Specifically, for each of shots arranged in the form of a lattice on the wafer 4, a focus condition changes in a horizontal direction, and a dose condition changes in a vertical direction. In other words, the focus condition is set to differ according to the position of a shot in the horizontal direction, and the dose condition is set to differ according to the position of a shot in the vertical direction. As a result, a process condition differing according to a shot is set. In this case, a center shot 20 on the wafer 4 is set as a reference process condition (a center condition). The reference process condition is a process condition used when a product is manufactured.

For example, a focus is changed in order from the left side to the right side of the wafer 4 and in order from a small value to a large value. Similarly, a focus is changed in order from the upper side to the lower side of the wafer 4 and in order from a small value to a large value. As a result, one exposure condition is set to one shot.

As the wafer 4 is exposed in this process condition, resist patterns can be formed in various process conditions. The defect detecting apparatus 2 performs the defect inspection on the wafer 4 in which the resist pattern is formed in this process condition.

Figure 4:
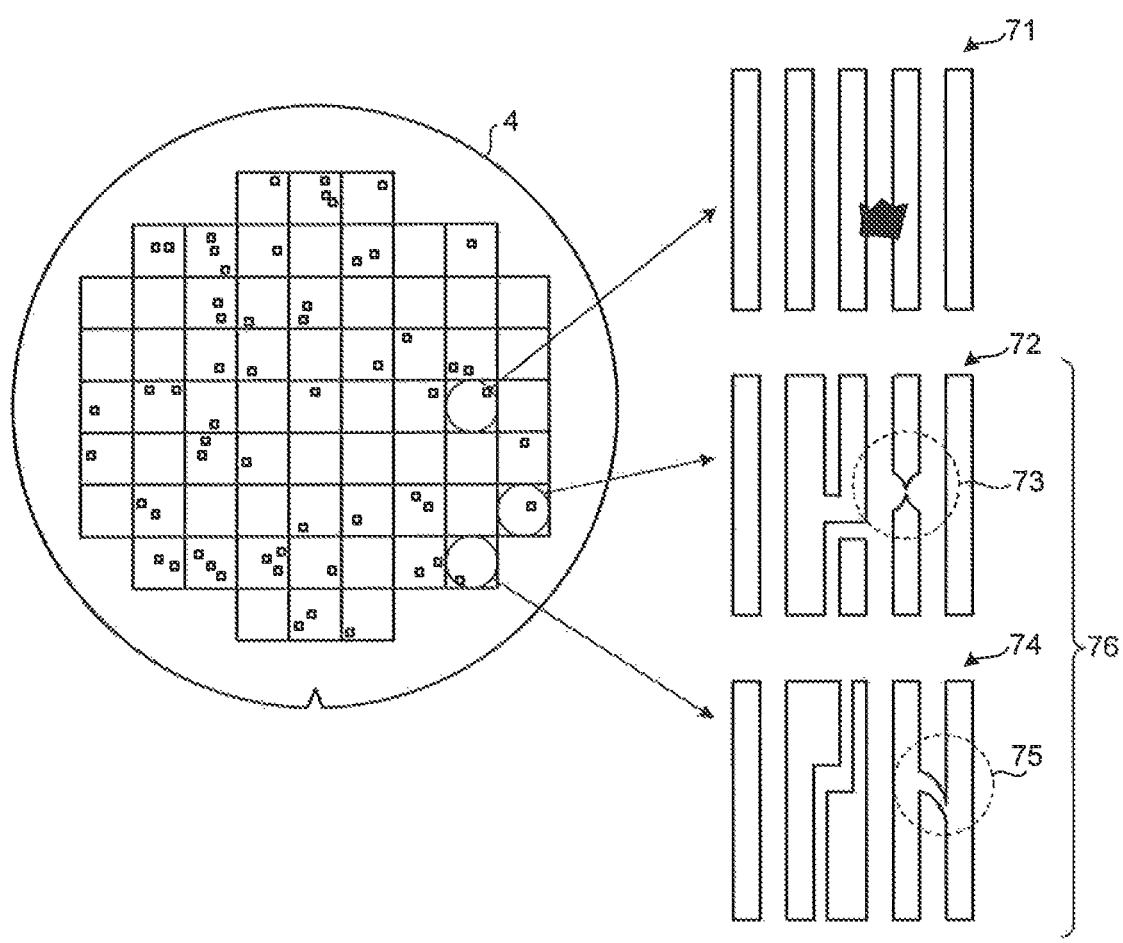
FIG. 4 is a diagram for describing the type of a defect.

Here, the type of a defect will be described, FIG. 4 is a diagram for describing the type of a defect. On the wafer 4, a random defect 71, a systematic defect 76, and the like occur as a defect of a pattern. The random defect 71 randomly occurs at various positions on the wafer 4.

Examples of the systematic defect 76 include an open defect 72 causing a pattern to be opened and a short-circuit defect 74 causing a pattern to be short-circuited.

The open defect 72 is a defect causing a pattern such as an interconnection to be disconnected, and the short-circuit defect 74 is a defect causing patterns such as interconnections to be short-circuited. In FIG. 4, a disconnection position of the open defect 72 is represented by a position 73, and a short-circuit position of the short-circuit defect 74 is represented by a position 75.

The detection defect information transmitted from the defect detecting apparatus 2, the pattern layout of a shot pattern formed on the wafer 4, and the process condition of each shot set on the wafer 4 are input to the input unit 11 of the defect pattern evaluation apparatus 3.

The input unit 11 transfers the detection defect information and the pattern layout to the classifying unit 12. Further, the input unit 11 transfers the pattern layout to the defect occurrence rate calculating unit 14, and transfers the process condition of each shot to the evaluating unit 15.

When an evaluation of a defect is performed, all of detected defects may be reviewed, but since it takes along time and effort, it is no realistic. For this reason, for example, about 1,000 defects are selected from among detected defects as defects to be reviewed. In this case, when defects are randomly sampled, for example, if a lot of specific defects (patterns) are extracted, other defects may be missed. For this reason, the classifying unit 12 classifies the pattern of defects before sampling.

For example, the classifying unit 12 classifies defects according to a pattern layout using a technique such as the design based binning (DBB). Specifically, the classifying unit 12 classifies defects according to a pattern layout by causing the position of a defect in the detection defect information and information (for example, the pattern layout) of a pattern corresponding to the position to be subjected to the DBB (step S20).

Then, the classifying unit 12 associates the detection defect information (the position and image of a defect) with the classification result (the pattern layout). As a result, information related to the pattern layout in which each defect has occurred, the position of a defect, and an image of a defect are associated with one another. The associated information is transferred to the defect number counting unit 13 as the classification information.

The defect number counting unit 13 counts the defect number of each pattern layout based on the classification information (step S30). The defect number counting unit 13 associates the defect number of each pattern layout with the pattern layout (the defect occurrence layout), and transfers the associated information to the defect occurrence rate calculating unit 14.

Figure 5:
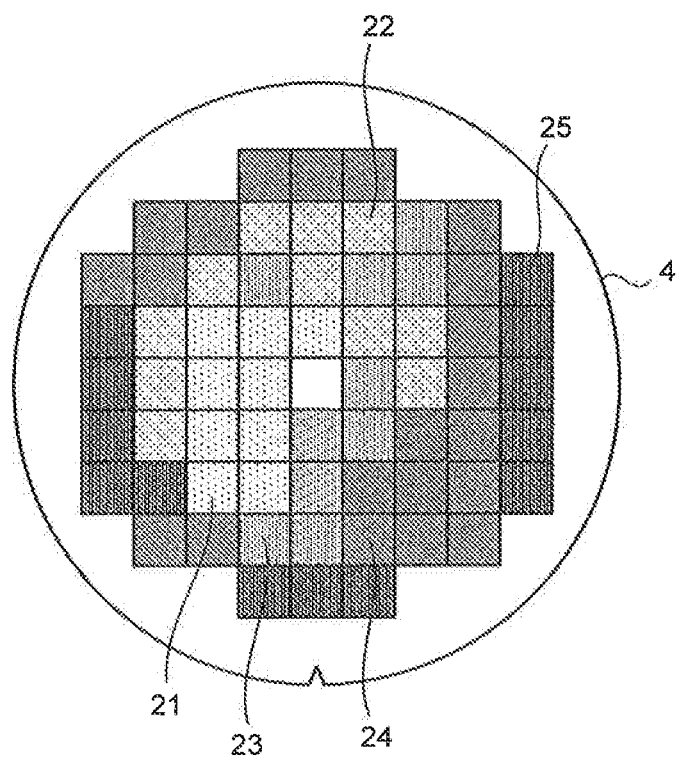
FIG. 5 is a diagram illustrating a distribution example of a detect number.

Here, the defect number of each pattern layout will be described. FIG. 5 is a diagram illustrating a distribution example of a defect number, and FIG. 6 is a diagram for describing the defect number of each pattern layout. On the wafer 4, shots having many defects and shots having small defects are present together.

In FIG. 5, a shot having a defect number smaller than N1 (N1 is a natural number) is represented by a shot 21. A shot having a defect number between N1 and N2 (N2 is a natural number satisfying N1≤N2) is represented by a shot 22, and a shot having a defect number between N2 and N3 (N3 is a natural number satisfying N2<N3) is represented by a shot 23. Further, a shot having a defect number between N3 and N4 (N4 is a natural number satisfying N3<N4) is represented by a shot 24, and a short having a defect number of N4 or more is represented by a shot 25 in FIG. 5, a shot having a range of the same defect number as the defect number of each of the shots 21, 22, 23, and 24 is represented by the same pattern.

A horizontal axis of a graph illustrated in FIG. 6 is a pattern number of a pattern layout whose number is given in the descending order of the number of defects, and a vertical axis is a defect number. For example, a pattern layout 31 having the largest number of defects is assigned a layout number (a defect number) 1, and a pattern layout having the second largest number of defects is assigned a layout number 2.

Similarly, a pattern layout 32 having the 13-th largest number of defects is assigned a layout number 13, and a pattern layout 33 having the 22-nd largest number of defects is assigned to a layout number 22. As described above, each pattern layout having a defect is assigned a different layout number.

The defect occurrence rate calculating unit 14 obtains the arrangement number of the defect occurrence layout in the inspection region based on the pattern layouts of all shots transferred from the input unit 11 and the defect occurrence layout transferred from the defect number counting unit 13. In other words, the defect number counting unit 13 obtains the number of specific patterns having a defect which are originally present within the inspection region based on the pattern layout (design pattern information). As described above, the defect occurrence rate calculating unit 14 counts the number of the same pattern layouts as the defect occurrence location which are present within the inspection region (step S40).

At this time, the defect occurrence rate calculating unit 14 may obtain the arrangement number of the defect occurrence layouts from the whole inspection region or may calculate the arrangement number of the defect occurrence layouts by multiplying the number of defect occurrence layouts within one chip by the number of inspection chips within the inspection region.

The defect occurrence rate calculating unit 14 calculates the defect occurrence rate based on the arrangement number of the defect occurrence layouts and the defect number of each pattern layout (step S50). The defect occurrence rate is a value obtained by dividing the number of detected defects by the arrangement number of the defect occurrence layouts corresponding to the detected defects. The defect occurrence rate calculating unit 14 ranks the defects in the descending order of the defect occurrence rate.

The defect occurrence rate calculating unit 14 associates the defect occurrence ranking of each defect with the position of each defect, and transmits the associated information to the SEM 5 as the defect position information. Further, the defect occurrence rate calculating unit 14 associates the defect occurrence rate, the defect occurrence ranking, the position of a defect, and the defect number with each other for each pattern layout, and transfers the associated information to the evaluating unit 15 as the defect occurrence rate information.

Figure 7A:
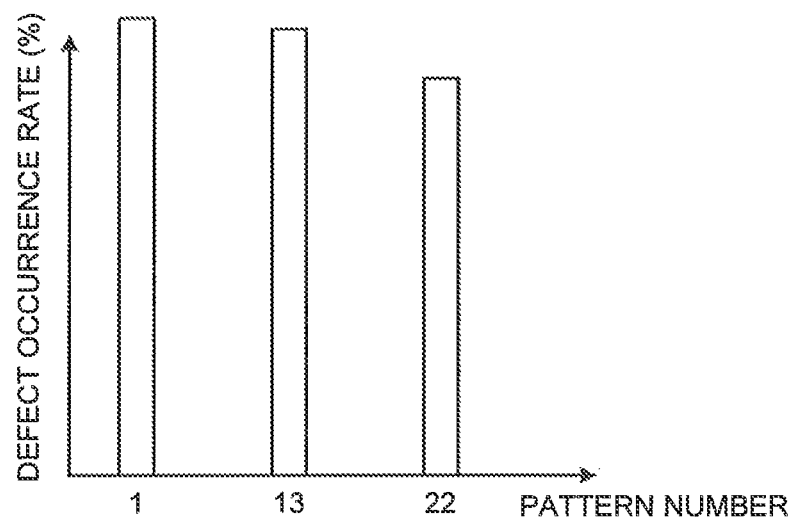
FIG. 7A is a diagram illustrating an example of a defect occurrence rate of each pattern layout.
Figure 7B:
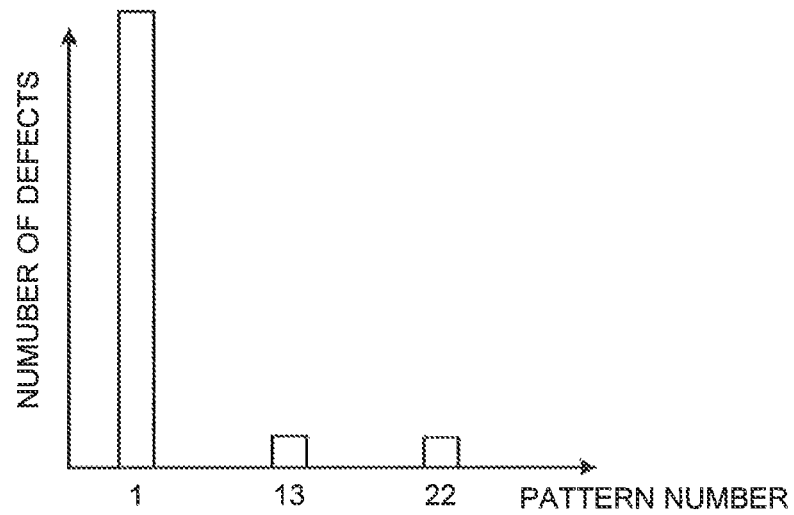
FIG. 7B is a diagram illustrating an example of a defect number of each pattern layout.

Here, the defect occurrence rate will be described. FIG. 7A is a diagram illustrating an example of the defect occurrence rate of each pattern layout, and FIG. 7B is a diagram illustrating an example of the defect number of each pattern layout. In FIG. 7A, a horizontal axis represents a pattern number, and a vertical axis represents a defect occurrence rate. In FIG. 7B, a horizontal axis represents a pattern number, and a vertical axis represents a defect number.

As illustrated in FIG. 7A, the pattern layouts of the pattern numbers 1, 13, and 22 have the defect occurrence rate of the almost same degree. However, as illustrated in FIG. 7B, the pattern layout of the pattern number 1 has the defect number larger than the pattern layouts of the pattern numbers 13 and 22.

For example, when the defect number of the pattern number 1 is 6078 and the arrangement number of the defect occurrence layouts is 2,812,320, the defect occurrence rate is 0.216% (=6078÷2812320). Similarly, when the defect number of the pattern number 13 is 46 and the arrangement number of the defect occurrence layout is 22,680, the defect occurrence rate is 0.203% (=46÷22680). Further, when the defect number of the pattern number 22 is 43 and the arrangement number of the defect occurrence layout is 22,680, the defect occurrence rate is 0.190% (=43÷22680).

Based on the defect occurrence rate calculated as described above, the evaluating unit 15 ranks the pattern layout in the descending order of the defect occurrence rate. As a result, the pattern layout having a ranking different from a ranking based on the defect number is ranked high. For example, the pattern layouts 31 to 33 of the pattern numbers 1, 13, and 22 are ranked high.

In the optical inspection by the defect detecting apparatus 2, since many false defects or the like are extracted (for example, several percentages (%) to several tens of percentages (%)), in order to determine whether or not there is a false defect, a defect location is reviewed through the SEM 5 (for example, Defect Review SEM (DRSEM)).

Through the SEM 5, a defect is reviewed using the information in which the defect occurrence ranking of each defect is associated with the position of each defect, and it is determined whether or not the defect is the false or random defect. At this time, a defect of a pattern layout having a high defect occurrence ranking is preferentially reviewed. For example, about 1,000 to 3,000 defects are selected as the number of defects to be reviewed.

When a defect to be reviewed is randomly selected, a pattern which is high in the arrangement number of the pattern layouts is selected, and thus a pattern to be reviewed is selected according to the ranking based on the defect occurrence rate. Thus, various patterns can be reviewed.

As a method of selecting a defect to be reviewed, for example, there is a method of selecting patterns of 1% from each of all 1,712 types of defects when there are 1,712 types of defects (the pattern layout in which a defect has occurred). Further, there is a method of selecting patterns which are high in the defect number from among 1,712 types, for example, 5 patterns from among 200 types. Then, through the SEM 5, each defect is observed based on the position of the defect of the selected pattern.

Thereafter, each defect is classified into one of the false or random defect and the systematic defect based on the observation result using the SEM 5, and thus the systematic defect is extracted (step S60).

For example, the position of the systematic defect is transmitted from the SEM 5 to the evaluating unit 15. The evaluating unit 15 deletes the information related to the false or random defect from the defect occurrence rate information based on the position of the systematic defect transmitted from the SEM 5. As a result, the evaluating unit 15 extracts only the systematic defect. Then, the evaluating unit 15 derives the process margin based on the presence or absence of the systematic defect of each shot and the process condition of each shot.

Specifically, the evaluating unit 15 determines whether or not a defect has occurred in each shot for each pattern layout, and determines that the process margin is insufficient on the shot (process condition) in which a defect has occurred. The evaluating unit 15 derives the entire process margin by obtaining a shot in which the process margin is insufficient, for each pattern layout and synthesizing the process margins of the respective pattern layouts.

Figure 8:
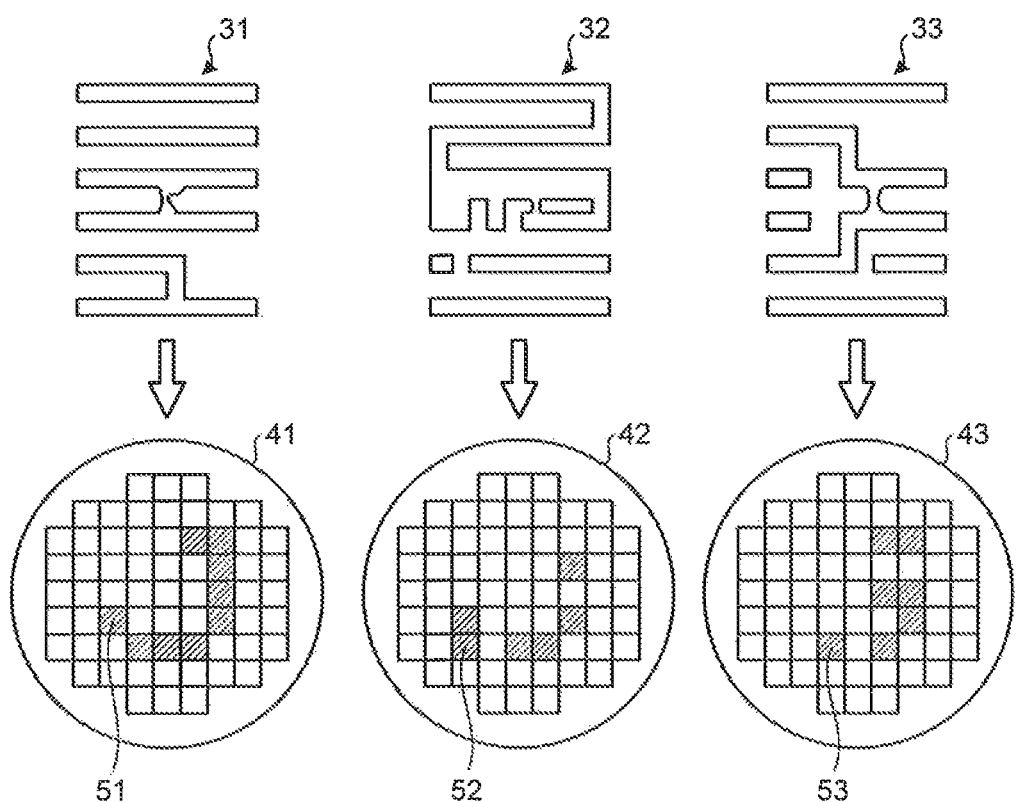
FIG. 8 is a diagram for describing a process margin of each pattern layout.

FIG. 8 is a diagram for describing the process margin of each pattern layout. Each pattern layout has a defect number differing according to a shot, it is because a process condition differs according to a shot. The evaluating unit 15 determines whether or not a defect has occurred in each shot for each pattern layout.

FIG. 8 illustrates a shot map 41 showing a shot 51 in which a defect has occurred in the pattern layout 31, a shot map 42 showing a shot 52 in which a defect has occurred in the pattern layout 32, and a shot map 43 showing a shot 53 in which a defect has occurred in the pattern layout 33. In FIG. 8, for a shot other than a shot in which an exposure margin is set, a defect shot is not illustrated. Further, in FIG. 8, each of the reference numerals of the shots 51, 52, and 53 in which a defect has occurred indicates only one shot, but a region having a similar pattern within each shot map has a defect, similarly to the shots 51, 52, and 53.

The shot 51 is the process condition in which a defect occurs in the pattern layout 31 and this determined to be a process condition having an insufficient process margin. Further, the shot 52 is the process condition in which a defect occurs in the pattern layout 32 and thus determined to be a process condition having an insufficient process margin. Further, the shot 53 is the process condition in which a defect occurs in the pattern layout 33 and thus determined to be a process condition having an insufficient process margin. As described above, the process margin differs according to the type of the pattern layout. For example, it can be understood that the process margin of the pattern layout 31 (the pattern number 1) is narrowest.

The evaluating unit 15 synthesizes the process conditions (process margins) of the respective, pattern layouts. For example, all FEM margins of the respective pattern layouts are synthesized, and thus a total of systematic defect margins in the wafer 4 can be obtained.

As described above, a pattern is formed on the wafer 4 in the process condition set to each shot, and it is determined whether or not there is a pattern layout in which the systematic defect has occurred for each shot. Then, based on the determination result, it is determined whether or not the process condition is acceptable for each shot, and the process margin is obtained based on the acceptance determination result. At this time, the process margin is determined for each pattern layout, and the respective determination results are synthesized to thereby obtain a total of process margins.

Figure 9A:
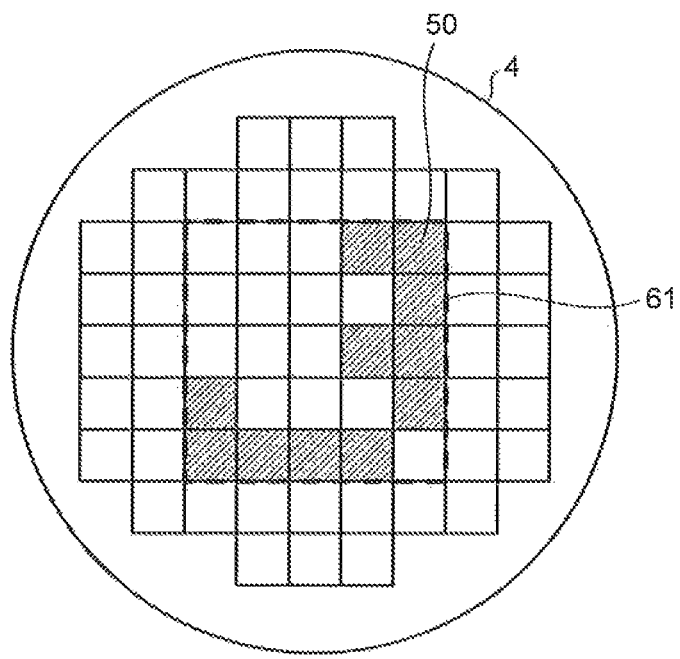
FIG. 9A is a diagram for describing a process margin evaluated based on a defect occurrence rate of a systematic defect.
Figure 9B:
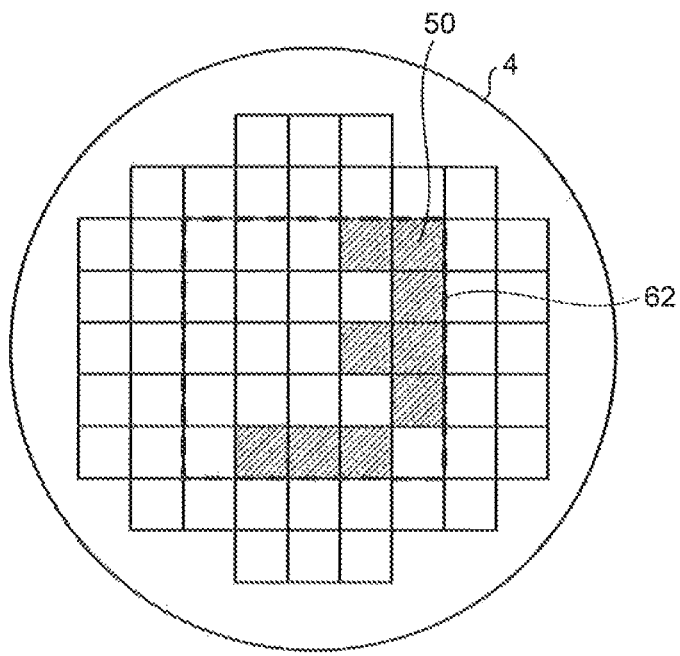
FIG. 9B is a diagram for describing a process margin evaluated based on a defect number of a systematic defect.

FIG. 9A is a diagram for describing a process margin evaluated based on the defect occurrence rate of the systematic defect, and FIG. 9B is a diagram for describing a process margin evaluated based on the defect number of the systematic defect.

FIG. 9A illustrates a process margin (a usable process condition) derived by synthesizing the process margins illustrated in FIG. 8. In other words, FIG. 9A illustrates a process margin derived when a defect is reviewed based on the defect occurrence rate. FIG. 9B illustrates a process margin derived when a defect is reviewed based on the defect number. In FIGS. 9A and 9B, for a shot other than a shot in which an exposure margin is set, a defect shot is not illustrated.

A shot in which an exposure margin needed by the exposure apparatus is set is present inside boundaries 61 and 62 illustrated in FIGS. 9A and 9B. For this reason, it is desirable that a defect does not occur inside the boundaries 61 and 62, but the occurrence of a defect may be detected depending on the evaluation result. In this case, since the process margin is insufficient, for example, it is necessary to increase the process margin by correcting the pattern layout or changing the manufacturing process.

As illustrated in FIG. 9A, when a defect is reviewed based on the defect occurrence rate, 11 shots could be extracted as an unusable process condition (a shot 50), whereas as illustrated in FIG. 9B, when a defect is reviewed based on the defect number, only 9 shots could be extracted as an unusable process condition (the shot 50).

The evaluating unit 15 transfers the derived process margin to the output unit 16 as the evaluation result. Then, the output unit 16 outputs the evaluation result to an external device such as a display device. As a result, the evaluation result is displayed on the display device (step S70).

Further, the evaluating unit 15 may output the detection defect information, the classification information, the defect occurrence layout, the defect occurrence rate information (the defect occurrence rate, the defect occurrence ranking, and the position of a defect), and the like to the output unit 16. For example, the evaluating unit 15 may output the defect occurrence rate of each defect occurrence layout to the output unit 16 as the evaluation result. Furthermore, the evaluating unit 15 may output the number of defect occurrence layouts in which the systematic defect has occurred and the number of types thereof to the output unit 16 as the evaluation result. In addition, the evaluating unit 15 may output ranking of the defect occurrence rate of each pattern layout to the output unit 16 as the evaluation result.

Here, a method of evaluating a defect based on the defect number will be described. In this case, the detection defect information is generated. Then, the detected defect is classified according to a pattern layout, and defects having the same pattern layout are ranked in the descending order of the defect number.

Thereafter, the defect is reviewed through the SEM to determine whether or not the defect is the false defect. At this time, when the defect to be reviewed is randomly selected, a pattern layout which is high in the defect number is selected, and thus various pattern layouts are reviewed using ranking based on the defect number.

For example, the defects to be reviewed are selected by a predetermined ratio from all defect types, similarly to the defect evaluation system described above. Then, through the SEM, each defect is reviewed based on the position of the defect of the selected pattern, and thus the systematic defects from which the false and random defects are excluded are extracted. The FEM margin of each pattern layout (each defection classification) is derived based on the review result. Through the same method as in the defect evaluation system described above, the FEM margins are synthesized, and thus a total of systematic defect margins in the wafer 4 is derived.

Next, a difference in the evaluation result between when a defect is evaluated based on the defect occurrence rate and when a defect is evaluated used on the defect number will be described. For example, the defect number of the pattern layout 31 (the pattern number 1) is assumed to be 6,078, whereas the detect numbers of the pattern layouts 32 and 33 (the pattern numbers 13 and 22) are assumed to be 46 and 43, respectively. Further, the arrangement number of the defect occurrence layouts of the pattern layout 31 is assumed to be 2,812,320, whereas the arrangement number of the defect occurrence layouts of the pattern layouts 32 and 33 are assumed to be 22,680.

In this situation, when the important pattern layout having the high defect occurrence rate is extracted, the evaluating unit. 15 can also extract the pattern layouts 32 and 33, similarly to the pattern layout 31. It is because the defect occurrence rate of the pattern layout 31 is 0.216%, whereas the defect occurrence rate of the pattern layout 32 is 0.203%, and the defect occurrence rate of the pattern layout 33 is 0.190%. As described above, as the pattern layout having the high defect occurrence rate is extracted, all the important defects such as the pattern layouts 32 and 33 can be detected as the systematic defect.

Meanwhile, the pattern layouts 32 and 33 are 1/100 of the pattern layout 31 or less in the arrangement number of the defect occurrence layout and thus is 1/100 of the pattern layout 31 or less in the detected defect number. For this reason, when the pattern layouts 31 to 33 are defect-classified in the descending order of the defect number, the pattern layouts 32 and 33 are not ranked high. For this reason, the defects of the pattern layouts 32 and 33 are not within the SEM observation point but likely to be missed. When the defects are missed, the manufacturing yield of the product is accordingly lowered.

When the defect is evaluated based on the defect occurrence rate and when the defect is evaluated based on the defect number, 1,801 locations were selected and observed by the SEM 5. As a result, when the defect is evaluated based on the defect occurrence rate, 412 defects were found out to be the systematic defects. Further, the 412 defects were classified into 85 types of pattern layouts.

Meanwhile, when the defect is evaluated based on the defect number, 353 defects were found out to be the systematic defects. Further, the 353 defects were classified into 76 types of pattern layouts.

As described above, when the defect is evaluated based on the defect occurrence rate, the number of types of pattern layouts extracted as the systematic defect was larger than when the defect is evaluated based on the defect number. As described above, when the defect is evaluated based on the defect occurrence rate, the extraction accuracy of the systematic defect was higher than when the defect is evaluated based on the defect number. Thus, when the defect is reviewed based on the defect occurrence rate, the process margin could be determined more accurately than when the defect is reviewed based on the defect number.

Further, after the exposure margin capable of preventing the occurrence of the systematic defect is set based on the defect occurrence rate, an electrical characteristic of each pattern layout was actually evaluated using the wafer 4. As a result, all of the pattern layouts 31 to 33 were found out to be the important defects affecting the yield of the product.

Further, in the wafer which has been subject to the exposure in the same condition, the pattern layouts 31 to 33 were observed at a plurality of positions through the SEM 5, and a probability that the pattern layouts 31 to 33 will be a defect was inspected. As a result, all of the pattern layouts 31 to 33 were found out to be the same and high in a probability to be a defect. Through this fact, the pattern layouts 31 to 33 could be recognized as the important defect.

Meanwhile, when the defect is evaluated based on the defect number, the pattern layout 31 was detected as the pattern layout in which the systematic defect occurs, but the pattern layouts 32 and 33 were not detected as the pattern layout in which the systematic defect occurs. It is because the pattern layouts 32 and 33 were detected as the pattern layout in which a defect has occurred but small in the extraction number, and thus ranked low in pattern classification (the descending order of the number). As a result, any of the pattern layouts 32 and 33 was not within a place to be reviewed. For this reason, when the defect is evaluated based on the defect number, the pattern layouts 32 and 33 were not detected as the systematic defect.

For example, the defect evaluation by the defect evaluation system is performed for each layer of a wafer process. Then, a semiconductor device (a semiconductor integrated circuit) is manufactured using a mask whose pattern layout has been corrected as necessary. Specifically, a mask (a product mask or the like) is manufactured using the corrected mask pattern or a mask pattern determined to be acceptable, and a wafer is product wafer or the like) coated with a resist is subjected to the light exposure using the product mask. Thereafter, the product wafer is developed, and so a resist pattern is formed on the product wafer. Then, the lower layer side of the resist pattern is etched using the resist pattern as a mask. As a result, an actual pattern corresponding to the resist pattern is formed on the product wafer. When a semiconductor device is manufactured, the defect evaluation, the correction of the pattern layout, the exposure process, the developing process, the etching process, and the like are repeated for each layer. Further, a nanoimprint lithography (NIL) or the like may be used as the lithography process.

Figure 10:
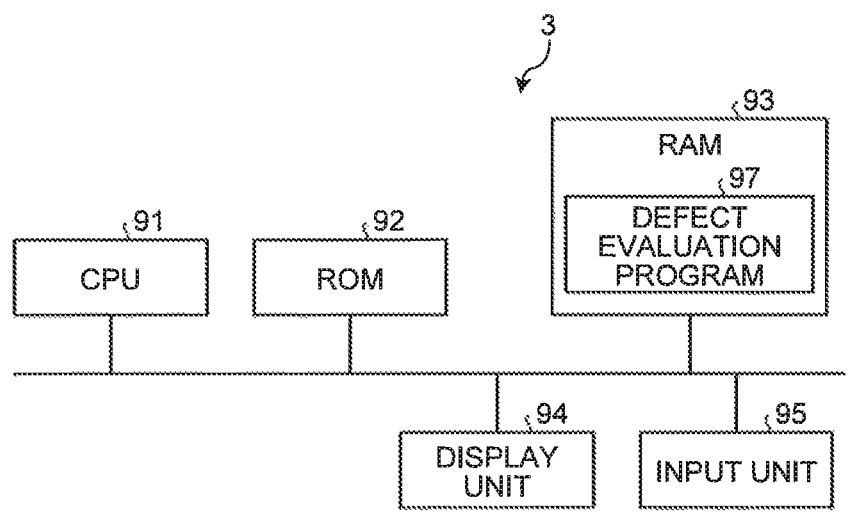
FIG. 10 is a diagram illustrating a hardware configuration of a defect pattern evaluation apparatus.

Next, a hardware configuration of the defect pattern evaluation apparatus 3 will be described. FIG. 10 is a diagram illustrating a hardware configuration of the defect pattern evaluation apparatus. The defect pattern evaluation apparatus 3 includes a central processing unit (CPU) 91, a read only memory (ROM) 92, a random access memory (RAN) 93, a display unit 94, and an input unit 95. In the defect pattern evaluation apparatus 3, the CPU 91, the ROM 92, the RAM 93, the display unit 94, and the input unit 95 are connected with one another via a bus line.

The CPU 91 performs a pattern determination using a defect evaluation program 97 which is a computer program. The defect evaluation program 97 is a computer program product which can be executed by a computer and has a non-transitory computer-readable recording media including a plurality of commands for evaluating a defect. The defect evaluation program 97 causes a computer to evaluate a defect through the plurality of commands.

The display unit 94 is a display device such as a liquid crystal monitor, and displays the detection defect information, the classification information, the defect occurrence layout, the defect occurrence rate information, the evaluation result, and the like based on an instruction from the CPU 91. The input unit 95 is configured to include a mouse or a keyboard, and receives instruction information (a parameter necessary for defect evaluation or the like) externally input from the user. The instruction information input to the input unit 95 is transferred to the CPU 91.

The defect evaluation program 97 is stored in the ROM 92 and loaded in the RAM 93 via the bus line. FIG. 10 illustrates a state in which the defect evaluation program 97 is loaded in the RAM 93.

The CPU 91 executes the defect evaluation program 97 loaded in the RAM 93. Specifically, in the defect pattern evaluation apparatus 3, in response to the instruction input through the input unit 95 by the user, the CPU 91 reads the defect evaluation program 97 from the ROM 92, develops the defect evaluation program 97 in a program storage region in the RAM 93, and executes various kinds of processes. The CPU 91 causes various kinds of data generated when various kinds of processes are performed to be temporarily stored in a data storage region formed in the RAM 93.

The defect evaluation program 97 executed by the defect pattern evaluation apparatus 3 has a module configuration including the classifying unit 12, the defect number counting unit 13, and the defect occurrence rate calculating unit 14 which are loaded into a main storage device and generated in the main storage device.

As a program to be executed by the defect pattern evaluation apparatus 3, a plurality of programs may be used for defect evaluation instead of one defect evaluation program 97. For example, each of the classifying unit 12, the defect number counting unit 13, and the defect occurrence rate calculating unit 14 may be assigned one program, and the defect evaluation may be performed using each program.

In the present embodiment, the wafer 4 of the FEM type is prepared in order to check the exposure margin, but all shots may be exposed in the same condition without changing the process condition. In this case, the pattern layout in which a defect is likely to occur can be extracted.

Further, the present embodiment has been described in connection with the example in which the defect of the resist pattern is evaluated, but a defect evaluation target may be a processed wafer in which a hard mask or the like has been processed from a resist pattern. Further, a defect evaluation target may be a wafer including an interconnection pattern formed such that metal such as aluminum or tungsten is buried after an oxide film process and is subjected to chemical mechanical polishing (CMP) as necessary.

As described above, according to the embodiment, since a defect is extracted based on a defect occurrence rate, even when a defect number is small, a pattern layout serving as an important defect can be accurately extracted and evaluated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A defect pattern evaluation method, comprising:
    performing, after a predetermined process for manufacturing a semiconductor device, optical defect inspection on a pattern on a substrate;
    detecting defects by the optical defect inspection;
    classifying, on the basis of a pattern layout that corresponds to coordinates of the defects, the defects by a type of the pattern layout;
    counting a number of the defects that are in each type of the pattern layout;
    calculating, using a computer, a defect occurrence rate for each type of the pattern layout by dividing the number of defects counted in each type of the pattern layout by a number of pattern layouts in each type of the pattern layout; and
    outputting the defect occurrence rate for each of the pattern layout as an evaluation result.

2. The defect pattern evaluation method according to claim 1, further comprising:
    extracting a predetermined number of defects from the defects based on a classification result of the pattern layout;
    observing the extracted defects through a scanning electron microscope (SEM);
    extracting a systematic defect occurring depending on the type of the pattern layout from the defects based on an observation result; and
    outputting the number of the pattern layouts in which the systematic defect has occurred and the number of types of the pattern layouts in which the systematic defect has occurred.

3. The defect pattern evaluation method according to claim 1, further comprising:
    ranking the pattern layouts based on the height of the defect occurrence rate; and
    outputting the ranking of each pattern layout.

4. The defect pattern evaluation method according to claim 1, further comprising:
    preferentially extracting a defect of a pattern layout which is high in the defect occurrence rate from the defects, and observing the extracted defect through the SEM.

5. The defect pattern evaluation method according to claim 1, further comprising:
    forming the pattern on the substrate in a process condition set to each shot;
    determining whether or not there is a pattern layout in which the systematic defect has occurred for each shot;
    determining whether or not the process condition is acceptable for each shot based on a determination result;
    obtaining a process margin based on an acceptance determination result; and
    outputting the process margin.

6. The defect pattern evaluation method according to claim 5, further comprising:
    determining the process margin for each pattern layout; and
    synthesizing the acceptance determination result to obtain the process margin.

7. The defect pattern evaluation method according to claim 2, further comprising:
    excluding a false defect and a random defect from the defects and extracting the systematic defect.

8. The defect pattern evaluation method according to claim 1,
    wherein the optical defect inspection is performed after a lithography, a hard mask process, gate pattern forming, or interconnection pattern forming.

9. A defect pattern evaluation apparatus, comprising:
    a classifying unit that classifies, on the basis of a pattern layout that corresponds to coordinates of defects, the defects by a type of the pattern layout, the defects being detected by performing, after a predetermined process for manufacturing a semiconductor device, optical defect inspection on a pattern on a substrate;
    a counting unit that counts a number of defects that are in each type of the pattern layout;
    a defect occurrence rate calculating unit that calculates a defect occurrence rate for each type of the pattern layout by dividing the number of defects counted in each type of the pattern layout by a number of pattern layouts in each type of the pattern layout; and
    an output unit that outputs the defect occurrence rate for each type of the pattern layout as an evaluation result.

10. The defect pattern evaluation apparatus according to claim 9, further comprising:
    an evaluating unit that extracts a systematic defect occurring depending on the type of the pattern layout from the defects using an SEM observation result of defects extracted based on a classification result of the pattern layout,
    wherein the evaluating unit calculates the number of pattern layouts in which the systematic defect has occurred and the number of types of the pattern layouts in which the systematic defect has occurred, and outputs a calculation result to the output unit.

11. The defect pattern evaluation apparatus according to claim 9,
    wherein the evaluating unit ranks the pattern layout based on the height of the defect occurrence rate, and outputs ranking of each pattern layout to the output unit.

12. The defect pattern evaluation apparatus according to claim 9,
    wherein when the pattern is formed on the substrate in a process condition set to each shot,
    the evaluating unit determines whether or not there is a pattern layout in which the systematic defect has occurred for each shot, determines whether or not the process condition is acceptable for each shot based on a determination result, obtains a process margin based on an acceptance determination result, and outputs the process margin to the output unit.

13. The defect pattern evaluation apparatus according to claim 12,
    wherein the evaluating unit determines the process margin for each pattern layout and obtains the process margin by synthesizing the acceptance determination result.

14. The defect pattern evaluation apparatus according to claim 10,
    wherein the evaluating unit excludes a false defect or random defect from the defects, and extracts the systematic defect.

15. A non-transitory computer-readable recording medium on which a defect evaluation program is recorded, the defect evaluation program causing a computer to evaluate a pattern on a substrate which has been subjected to, after a predetermined process for manufacturing a semiconductor device, optical defect inspection, the defect evaluation program causing the computer to execute:

classifying, on the basis of a pattern layout that corresponds to coordinates of defects detected by the optical defect inspection, the defects by a type of the pattern layout;

counting a number of defects that are in each type of the pattern layout:

calculating a defect occurrence rate for each type of the pattern layout by dividing the number of defects counted in each type of the pattern layout by a number of pattern layouts in each type of the pattern layout; and outputting the defect occurrence rate for each type of the pattern layout as an evaluation result.

16. The recording media according to claim 15, wherein the defect evaluation program causes the computer to further execute:

extracting a systematic defect occurring depending on the type of the pattern layout from the defects using an SEM observation result of defects extracted based on a classification result of the pattern layout; and outputting the number of pattern layouts in which the systematic defect has occurred and the number of types of the pattern layouts in which the systematic defect has occurred.

17. The recording media according to claim 15, wherein the defect evaluation program causes the computer to further execute:

ranking the pattern layout based on the height of the defect occurrence rate; and outputting ranking of each pattern layout.

18. The recording media according to claim 15, wherein the defect evaluation program causes the computer to further execute:

when the pattern is formed on the substrate in a process condition set to each shot, determining whether or not there is a pattern layout in which the systematic defect has occurred for each shot;

determining whether or not the process condition is acceptable for each shot based on a determination result;

obtaining a process margin based on an acceptance determination result; and outputting the process margin.

19. The recording media according to claim 18, wherein the defect evaluation program causes the computer to further execute:

determining the process margin for each pattern layout; and obtaining the process margin by synthesizing the acceptance determining result.

20. The recording media according to claim 16, wherein the defect evaluation program causes the computer to further execute:

extracting the systematic defect by excluding a false defect or a random defect from the defects when the systematic defect is extracted.

* * * * *